United States Patent [19]
Yoshida

[11] Patent Number: 5,855,732
[45] Date of Patent: Jan. 5, 1999

[54] OUTER LEAD BONDING APPARATUS AND METHOD OF BONDING LEAD TO SUBSTRATE

[75] Inventor: Yuichi Yoshida, Tokyo, Japan

[73] Assignee: NEC Corporation, Tokyo, Japan

[21] Appl. No.: 560,632

[22] Filed: Nov. 20, 1995

[30] Foreign Application Priority Data

Nov. 22, 1994 [JP] Japan ................................. 6-287738

[51] Int. Cl.⁶ ..................................................... H05K 3/32
[52] U.S. Cl. ............................ 156/539; 156/540; 29/741
[58] Field of Search .............................. 29/741; 156/539, 156/540

[56] References Cited

U.S. PATENT DOCUMENTS 5,231,753  8/1993  Tanaka et al. ............................ 29/741
5,249,356  10/1993  Okuda et al. ......................... 29/740 X

FOREIGN PATENT DOCUMENTS 4277641  10/1992  Japan .

*Primary Examiner*—Francis J. Lorin
*Attorney, Agent, or Firm*—Whitham, Curtis & Whitham

[57] ABSTRACT

The invention provides an outer lead bonding apparatus for bonding a plurality of leads extending outwardly of a semiconductor chip to bonding pads mounted on a substrate, the apparatus including (a) a bonding-aid member having a central portion and a marginal portion, the semiconductor chip being to be adhered to a lower surface of the central portion of the bonding-aid member, the bonding-aid member being to be adhered at the marginal portion thereof to the substrate, the bonding-aid member being formed with an opening for exposing distal ends of the leads at which the leads are to be bonded to the bonding pads, (b) a device for ascertaining whether the leads align with the bonding pads, and (c) a bonding tool having compressing portions for compressing the leads to the bonding pads, the compressing portions having a cross-section to be able to pass through the opening of the bonding-aid member. The invention makes it possible to avoid misalignment of the leads of a semiconductor chip to the bonding pads by simpler arrangement than prior apparatuses.

23 Claims, 6 Drawing Sheets

OUTER LEAD BONDING APPARATUS AND METHOD OF BONDING LEAD TO SUBSTRATE

BACKGROUND OF THE INVENTION

1. Field of the Invention

The invention relates to an outer lead bonding apparatus and a method for bonding a plurality of leads extending outwardly of a semiconductor chip to bonding pads mounted on a substrate. The invention further relates to a bonding-aid member to be used in the above mentioned apparatus and method.

2. Description of the Related Art

When a semiconductor chip is to be bonded to a circuit substrate, a plurality of leads placed on a carrier tape are first bonded to a plurality of electrodes formed on a surface of a semiconductor chip. Such a bonding is called inner lead bonding (ILB). Then, a plurality of leads extending outwardly of a semiconductor chip are cut so that all of the leads have a predetermined length. Then, distal ends of the leads are bonded to a plurality of bonding pads mounted on a wiring layer of a circuit substrate. Such a bonding is called outer lead bonding (OLB).

FIG. 1 illustrates an example of conventional outer lead bonding. A semiconductor chip 10 having leads 12 adhered to a lower surface of the semiconductor chip 10 and extending outwardly of the semiconductor chip 10 is vacuum-attracted to a jig 83 housed in a bonding tool 82. Then, a position detecting camera 63B detects the position of bonding portions 13 of the leads 12 at which the leads 12 are to be bonded to later mentioned bonding pads 32 mounted on a circuit substrate 30.

The circuit substrate 30 on which the semiconductor chip 10 is to be mounted is fixedly placed on a stage 81 which is movable in two directions perpendicular to each other and rotatable about a central axis thereof. The position of bonding pads 32 mounted on the substrate 30 is detected by a position detecting camera 63A at a location away from the semiconductor chip 10.

Then, in order to align the bonding portions 13 of the leads 12 to the bonding pads 32 mounted on the circuit substrate 30, the positions of are detected independently of each other, and one of them is moved towards another. For instance, the stage 81 is moved in a direction indicated by an arrow 85 to locate the circuit substrate 30 below the semiconductor chip 10. Namely, the stage 81 and hence the circuit substrate 30 is moved in a position indicated with a broken line in FIG. 1. Then, the bonding tool 82, having been heated at about 400 degrees centigrade is lowered to thereby exert about 200 grams load on every lead 12. Thus, the bonding portions 13 of the leads 12 are connected to the bonding pads 32 mounted on the substrate 30.

However, this method has a defect, in that since the jig 83 is housed in the bonding tool 82, the bonding portions 13 of the leads 12 and the bonding pads 32 of the substrate 30 are hidden by the bonding tool 82 while the bonding operation is being carried out. Thus, it is impossible to look at the bonding portions 13 of the leads 12 and the bonding pads 32 at the same time, and hence they have to be detected with respect to a position thereof independently of each other, and then one of them has to be moved to another.

As a result, it is not possible to directly confirm the alignment of the bonding portions 13 and the bonding pads 32 while the bonding is being carried out. Accordingly, even if misalignment occurs, the bonding is carried out anyway with the result being defective bonding.

An attempt for overcoming such a problem has been made in Japanese Unexamined Patent Public Disclosure No. 4-277641. FIG. 2 illustrates the method suggested in the Disclosure No. 4-277641. In that method, there is provided a jig for fixing a semiconductor chip in place, the jig comprising vacuum-attracting tubes or a mechanical clamp structure 86 for holding the semiconductor chip 10 at its four corners from which none of the leads 12 extends, a vacuum-attracting mechanism for attracting a lower surface of the semiconductor chip 10, and an opening region. In operation, the semiconductor chip 10 is first held with the jig at the corners 18 and the lower surface thereof. Then, it is ascertained through the opening of the jig as to whether the bonding portions of the leads align with the bonding pads mounted on the substrate. Then, the bonding tool is made to pass through the opening of the jig to compress the leads onto the bonding pads with the semiconductor chip 10 being held by the clamp structure 86.

However, the above mentioned method cannot be applied to a semiconductor chip having leads extending from corners thereof, a small-sized semiconductor chip, and a semiconductor chip having leads extending therefrom in significantly high density.

In addition, since a sidewall of a semiconductor chip is not a vertically extending wall, it is almost impossible to directly hold a semiconductor chip at its corners by the above mentioned vacuum-attracting tube or mechanical clamp structure 86.

Furthermore, the jig as suggested in the Disclosure No. 4-277641 has to have a significantly complicated structure, and hence is not suitable for practical use. When a semiconductor chip is to be supported at its corners by a vacuum-attracting tube as that of the Disclosure No. 4-277641, such a vacuum-attracting tube has to extend horizontally. Since it is necessary for the vacuum-attracting tube to be connected to a tube which is in communication with a vacuum source, the jig has to be enlarged in size. It is difficult to have a space for such an enlarged jig. Similarly, when a semiconductor chip is to be supported at its corners by a mechanical clamp structure, a controller for driving the clamp has to be complicated, and hence it is unavoidable for the jig to be enlarged in size, resulting in it being not practical to incorporate the clamp structure into an outer lead bonding apparatus.

SUMMARY OF THE INVENTION

It is an object of the present invention to provide an outer lead bonding apparatus by which the alignment of the bonding portions of the leads and the bonding pads mounted on the substrate can be readily accomplished without faults, and the leads can be readily bonded to the bonding pads.

It is another object of the present invention to provide a bonding-aid member to be used in the above mentioned outer lead bonding apparatus for making it easy to align the bonding portions of the leads and the bonding pads, and bond them to each other.

It is still another object of the present invention to provide a method of readily aligning the bonding portions of the leads to the bonding pads mounted on the substrate, and bonding the leads onto the bonding pads.

In one aspect, the invention provides an outer lead bonding apparatus for bonding a plurality of leads extending outwardly of a semiconductor chip to bonding pads mounted on a substrate, the apparatus including (a) a bonding-aid member including at least a central portion and a marginal portion, the semiconductor chip being to be adhered to a lower surface of the central portion of the bonding-aid member, the bonding-aid member being to be adhered at the marginal portion thereof to the substrate, the bonding-aid member being formed with an opening for exposing distal ends of the leads at which the leads are to be bonded to the bonding pads, (b) a device such as a camera for ascertaining whether the leads align with the bonding pads, and (c) a bonding tool having compressing portions for compressing the leads to the bonding pads, the compressing portions having a cross-section form able to pass through the opening of the bonding-aid member.

The invention further provides an outer lead bonding apparatus for bonding a plurality of leads extending outwardly of a semiconductor chip to bonding pads mounted on a substrate, the apparatus including (a) a bonding-aid member including a horizontally extending central portion, a vertically extending sidewall, a flange portion extending horizontally and outwardly from a lowermost end of the sidewall, and a support portion for connecting the central portion to the sidewall, the support portion being designed to form an opening between the central portion and the sidewall for exposing distal ends of the leads at which the lead are to be bonded to the bonding pads, the semiconductor chip being to be adhered to a lower surface of the central portion of the bonding-aid member, the bonding-aid member being to be adhered at the flange portion thereof to the substrate, (b) a device such as a camera for ascertaining whether the leads align with the bonding pads, and (c) a bonding tool having a wall for compressing the leads to the bonding pads to bond them with each other, the wall having a cross-section form able to pass through the opening of the bonding-aid member.

The invention still further provides an outer lead bonding apparatus for bonding a plurality of leads extending outwardly of a semiconductor chip to bonding pads mounted on a substrate, the apparatus including (a) a bonding-aid member composed of magnetic material and including at least a central portion and a marginal portion, the semiconductor chip being to be adhered to a lower surface of the central portion of the bonding-aid member, the bonding-aid member being formed with an opening for exposing distal ends of the leads at which the leads are to be bonded to the bonding pads, (b) a device such as a camera for ascertaining whether the leads align with the bonding pads, (c) a magnet disposed around the substrate, the marginal portion of the bonding-aid member being to be attracted to the magnet, and (d) a bonding tool having compressing portions for compressing the leads to the bonding pads, the compressing portions having a cross-section form able to pass through the opening of the bonding-aid member.

The invention yet further provides an outer lead bonding apparatus for bonding a plurality of leads extending outwardly of a semiconductor chip to bonding pads mounted on a substrate, the apparatus including (a) a bonding-aid member comprising a flat plate, the bonding-aid member including a central portion, a marginal portion, and a support portion for connecting the central portion to the marginal portion, the support portion being designed to form an opening between the central portion and the marginal portion for exposing distal ends of the leads at which the lead are to be bonded to the bonding pads, the semiconductor chip being to be adhered to a lower surface of the central portion of the bonding-aid member, the bonding-aid member being to be adhered at the marginal portion thereof to the substrate, the substrate being formed with a recess, the bonding pads being disposed on a bottom surface of the recess, the recess having a depth equal to a total height of the semiconductor chip and the bonding pad, (b) a device such as a camera for ascertaining whether the leads align with the bonding pads, and (c) a bonding tool having a wall for compressing the leads to the bonding pads to bond them with each other, the wall having a cross-section form able to pass through the opening of the bonding-aid member.

In another aspect, the invention provides a bonding-aid member for use with an outer lead bonding apparatus which bonds a plurality of leads extending outwardly of a semiconductor chip to bonding pads mounted on a substrate, the bonding-aid member including at least a central portion and a marginal portion, the semiconductor chip being to be adhered to a lower surface of the central portion of the bonding-aid member, the bonding-aid member being to be adhered at the marginal portion thereof to the substrate, and the bonding-aid member being formed with an opening for exposing distal ends of the leads at which the leads are to be bonded to the bonding pads.

The invention further provides a bonding-aid member for use with an outer lead bonding apparatus which bonds a plurality of leads extending outwardly of a semiconductor chip to bonding pads mounted on a substrate, the bonding-aid member including a horizontally extending central portion, a vertically extending sidewall, a flange portion extending horizontally and outwardly from a lowermost end of the sidewall, and a support portion for connecting the central portion to the sidewall, the support portion being designed to form an opening between the central portion and the sidewall for exposing distal ends of the leads at which the lead are to be bonded to the bonding pads, the semiconductor chip being to be adhered to a lower surface of the central portion of the bonding-aid member, and the bonding-aid member being to be adhered at the flange portion thereof to the substrate.

The invention still further provides a bonding-aid member for use with an outer lead bonding apparatus which bonds a plurality of leads extending outwardly of a semiconductor chip to bonding pads mounted on a substrate, the bonding-aid member including a flat plate which has a central portion, a marginal portion, and a support portion for connecting the central portion to the marginal portion, the support portion being designed to form an opening between the central portion and the marginal portion for exposing distal ends of the leads at which the lead are to be bonded to the bonding pads, the semiconductor chip being to be adhered to a lower surface of the central portion of the bonding-aid member, the bonding-aid member being to be adhered at the marginal portion thereof to the substrate, the substrate being formed with a recess, the bonding pads being disposed on a bottom surface of the recess, the recess having a depth equal to a total height of the semiconductor chip and the bonding pad.

In still another aspect, the invention provides a method of bonding leads of a semiconductor chip to bonding pads mounted on a substrate, the method including the steps of (a) providing a bonding-aid member including at least a central portion and a marginal portion, the bonding-aid member being formed with an opening for exposing distal ends of the leads at which the leads are to be bonded to the bonding pads, (b) adhering the semiconductor chip to a lower surface of the central portion of the bonding-aid member, (c) aligning distal ends of the leads to the bonding pads through the opening of the bonding-aid member, (d) adhering the bonding-aid member at the marginal portion thereof to the substrate, and (e) inserting a bonding tool through the opening of the bonding-aid member to compress the leads to the bonding pads.

In accordance with the above mentioned invention, since the bonding-aid member has an opening disposed above the bonding portion of the leads at which the leads are bonded to the bonding pads mounted on the substrate, it is possible to ascertain whether the leads of a semiconductor chip are aligned with the bonding pads through the opening without necessity of a complicated structure such as a vacuum-attracting mechanism for ascertaining the alignment, regardless of how the leads extend from a semiconductor chip, and also able to carry out the outer lead bonding of the leads onto the bonding pads through the opening of the bonding-aid member. Thus, the invention makes it possible to avoid defective bonding caused by the misalignment of the leads to the bonding pads by a simplified arrangement relative to the prior techniques.

In addition, it is possible to leave the bonding-aid member as a part of a semiconductor device after the outer lead bonding has been completed. In such a case, the bonding-aid member being composed of metal would enhance its electromagnetic shield effect and heat radiation property. Furthermore, by filling a space present between the bonding-aid member and the semiconductor chip with resin, the airtightness of a semiconductor device can also be enhanced.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 1:
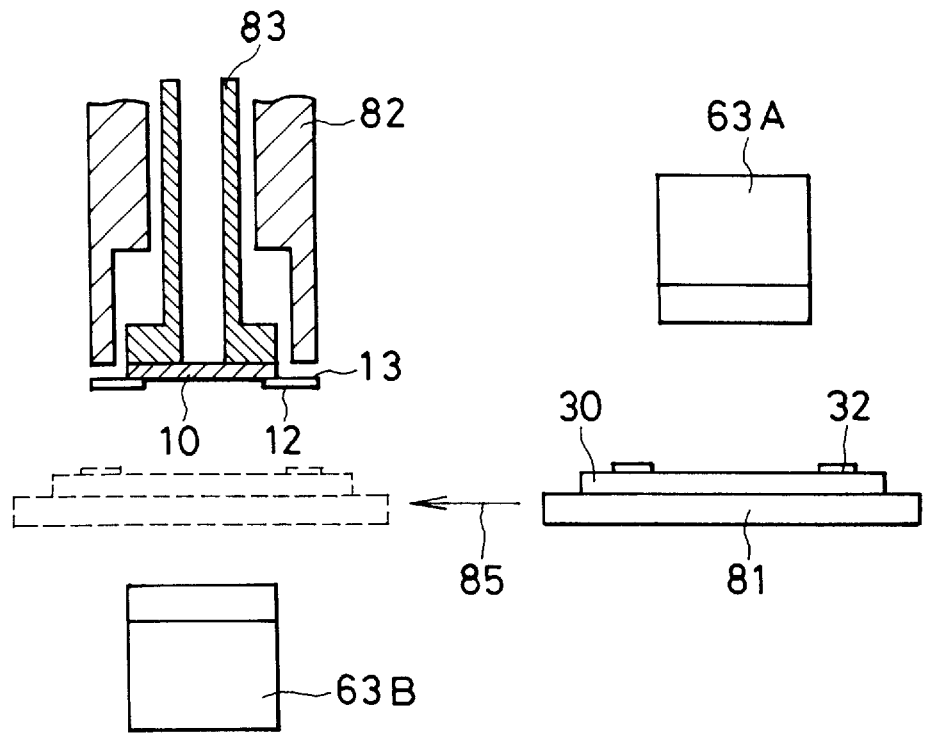
FIG. 1 is a schematic view illustrating a conventional outer lead bonding apparatus.
Figure 2:
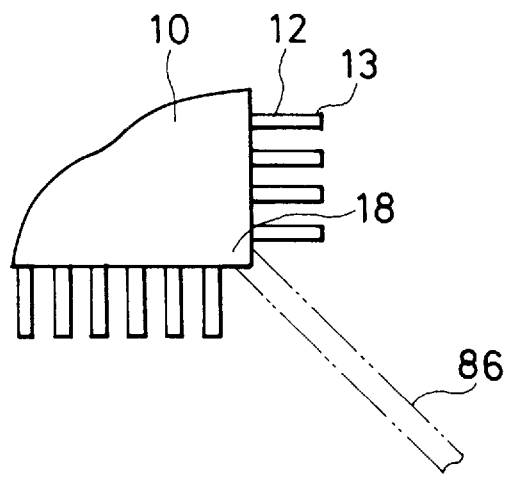
FIG. 2 is a partial plan view illustrating a part of another conventional outer lead bonding apparatus.

Preferred embodiments in accordance with the present invention will be explained hereinbelow with reference to the drawings.

FIGS. 3A to 6B illustrate an outer lead bonding apparatus in accordance with the first embodiment of the present invention. As best shown in FIG. 3B, a semiconductor chip 10 has a plurality of electrodes 11 formed on a lower surface of the chip 10. Leads 12 which are connected to the electrodes 11 extend outwardly of the semiconductor chip 10. Each of the leads 12 defines a bonding portion 13 at a distal end thereof, at which the lead 12 is bonded to a later mentioned bonding pad 32 mounted on a substrate 30.

Figure 4A:
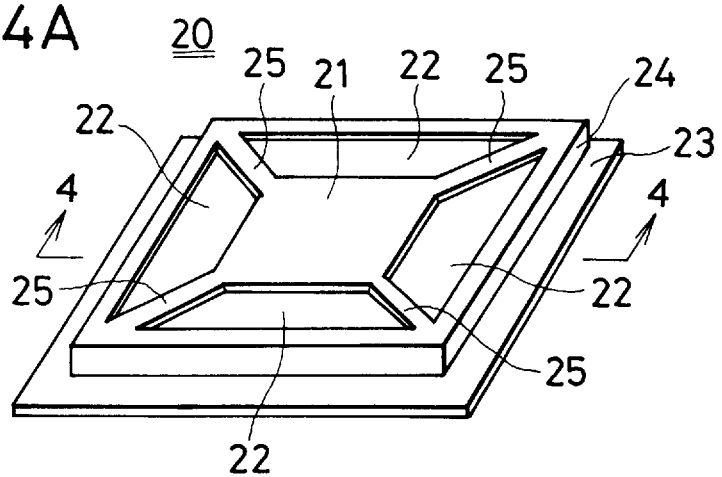
FIG. 4A is a perspective view illustrating a bonding-aid member to be used in the first embodiment of the invention.
Figure 4B:
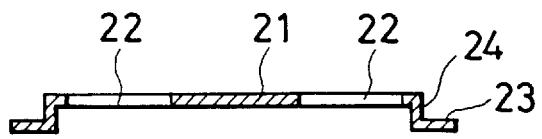
FIG. 4B is a cross-sectional view taken along the line 4—4 in FIG. 4A.

The semiconductor chip 10 is adhered to a bonding-aid member 20 illustrated in FIG. 4A. As illustrated in FIG. 4A, the bonding-aid member 20 comprises a horizontally extending central portion 21, a vertically extending sidewall 24, a flange portion 23 extending outwardly horizontally, from a lowermost end of the sidewall 24, and four support portions 25 for connecting the central portion 21 to the sidewall 24. The central portion 21 is rectangular in shape, and the sidewall 24 surrounds the central portion 21 similarly to the central portion 21 and also surrounds all of the bonding portions 13 of the leads 12. The four support portions 25 diagonally extend between the central portion 21 and the sidewall 24.

Thus, the bonding-aid member 20 has openings 22 between the central portion 21 and the sidewall 24 for exposing all the bonding portions 13 of the leads 12.

Figure 3A:
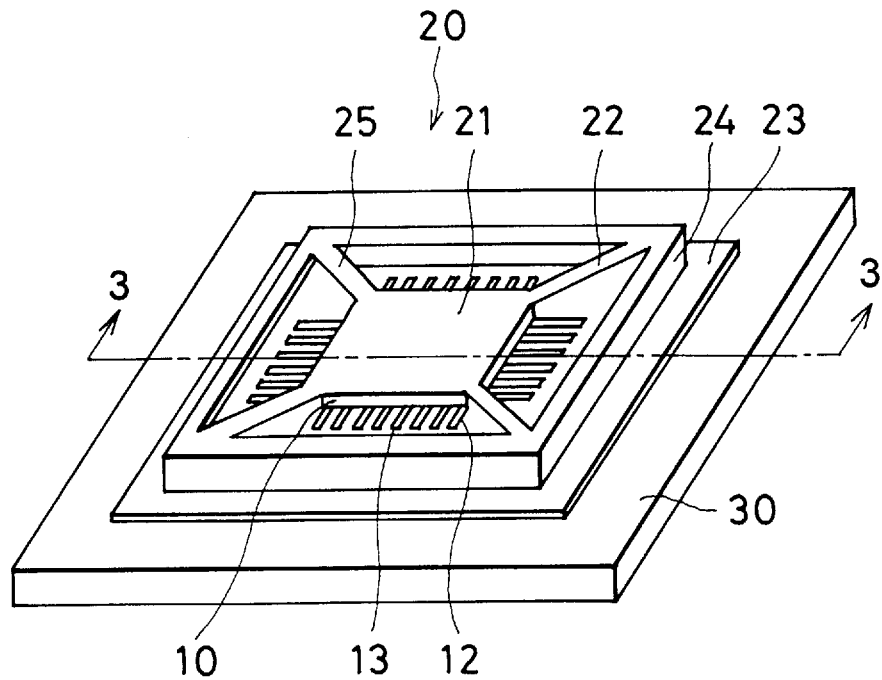
FIG. 3A is a perspective view illustrating a semiconductor chip adhered to the bonding-aid member to be used in the first embodiment of the invention.
Figure 3B:
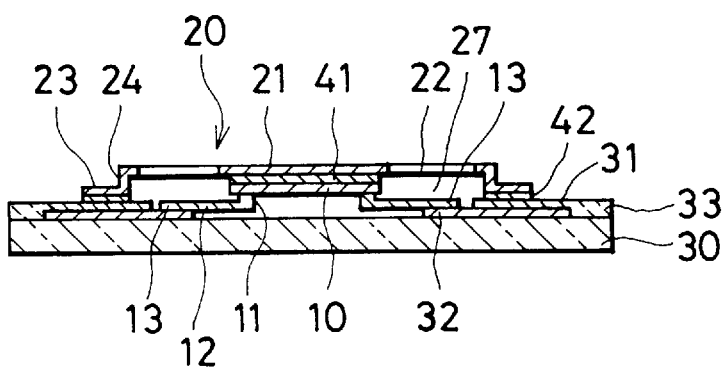
FIG. 3B is a cross-sectional view taken along the line 3—3 in FIG. 3A.

As illustrated in FIG. 3B, the semiconductor chip 10 is adhered at a lower surface thereof to a lower surface of the central portion 21 of the bonding-aid member 20 by means of an adhesive material 41 such as thermosetting resin or silver paste.

The bonding-aid member 20 is made up of a metal plate such as covar. An area surrounded by the sidewall 24 is 50 mm×50 mm, and the sidewall 24 is about 1 mm in height.

The example semiconductor chip 10 has an area 12.28 mm×15.70 mm, and has a total of 476 leads 12 therearound provided by a 476 pins tape having a width of 48 mm.

On an upper surface of the circuit substrate 30 is formed a wiring layer which is covered with an insulative material such as solder resist 33. By selectively removing the solder resist 33, the wiring layer 31 is partially exposed. The thus-exposed portions of the wiring layer 31 define bonding pads 32 on which the bonding portions 13 of the leads 12 are bonded by heat and pressure. The flange portion 23 of the bonding-aid member 20 is adhered onto the solder resist 33 by means of an adhesive 42 such as thermosetting resin.

The alignment of the bonding portions 13 of the leads 12 to the bonding pads 32 is carried out by observing them through the openings 22 of the bonding-aid member 20 by means of a monitor camera, for example. After it is ascertained through the openings 22 that the bonding portions 13 of the leads precisely sit on the bonding pads 32, a bonding tool 65 (see FIG. 5D) is lowered through the openings 22 to compress and hence bond the bonding portions 13 of the leads 12 to the bonding pads 32. Thus, there is no longer found a defective semiconductor chip caused by misalignment of the bonding portion 13 to the bonding pad 32 after the outer lead bonding has been completed.

In addition, by composing the bonding-aid member 20 of metal, it is possible to obtain an electromagnetic shield effect, and to enhance a heat radiation property of a reverse surface of the semiconductor chip 10.

However, it should be noted that the bonding-aid member 20 may be composed of an insulative material such as ceramic and plastic, if the electromagnetic shield effect and enhancement of the heat radiation property is not so important for a semiconductor chip.

In order to enhance the airtightness of the semiconductor chip 10, a space 27 formed between the semiconductor chip 10 and the bonding-aid member 20 may be filled with resin after the semiconductor chip 10 has been mounted on the substrate 30.

Hereinbelow will be explained the method of bonding the semiconductor chip 10 having the leads 12 to the substrate 30 having the bonding pads 32 mounted thereon. First, as illustrated in FIG. 5A, the semiconductor chip 10 is adhered at a reverse surface thereof to a lower surface of the central portion 21 of the bonding-aid member 20 by means of an adhesive material 41 such as thermosetting resin or silver paste.

Then, an upper surface of the central portion 21 of the bonding-aid member 20 is vacuum-attracted by a vacuum-attracting arm 61, and then the bonding-aid member 20 is moved to and mounted on the substrate 30 so that the bonding portions 13 of the leads 12 are disposed just above the bonding pads 32 formed on the substrate 30. The positional adjustment of the bonding portions 13 onto the bonding pads 32 is carried out under survey by a monitor camera 63 through the openings 22 of the bonding-aid member 20, as indicated with an arrow 53.

Figure 5A:
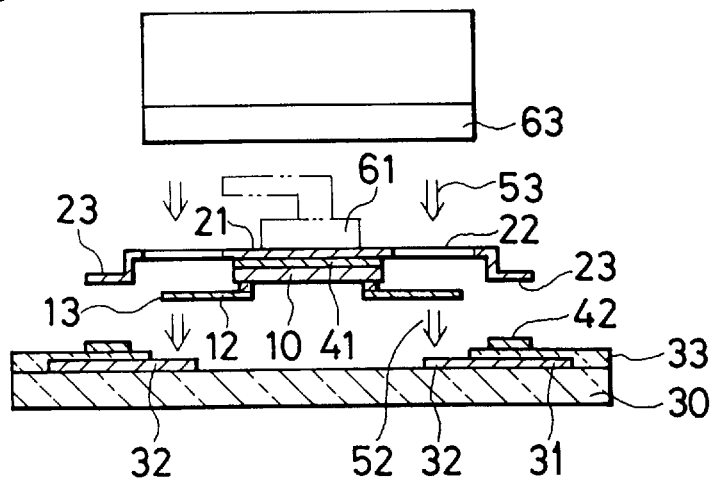
FIGS. 5A, 5B and 5C are cross-sectional views illustrating respective step in the method of bonding leads of a semiconductor chip to bonding pads mounted on a substrate.

As illustrated in FIG. 5A, an adhesive material 42 such as thermosetting resin are adhered in advance onto each of the solder resist 33. In the situation illustrated in FIG. 5A, the flange portion 23 of the bonding-aid member 20 is slightly vertically spaced away from the adhesive materials 42. The positional adjustment of the bonding portions 13 of the leads 12 onto the bonding pads 32 is carried out with the flange portion 23 being lowered just above the adhesive materials 42. The adhesive materials 42 may be adhered in advance to the flange portion 23 of the bonding-aid member 20.

After the positional adjustment of alignment has been completed, the bonding-aid member 20 to which the semiconductor chip 10 is being adhered is just vertically lowered onto the bonding pads 32, as indicated with an arrow 52. Thus, the bonding portions 13 of the leads 12 sit on, namely, are bonded onto the bonding pads 32 precisely in position, as illustrated in FIG. 5B.

Figure 5B:
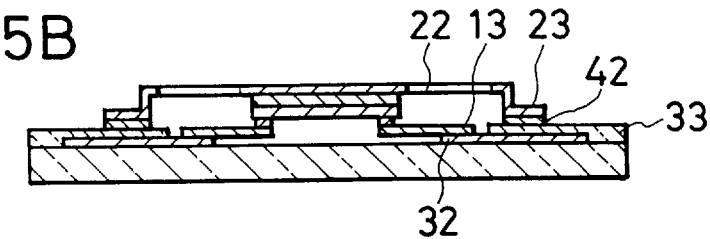

In FIG. 5B, the flange portion 23 of the bonding-aid member 20 is fixedly adhered to the solder resist 33 through the adhesive materials 42. On the other hand, the bonding portions 13 of the leads 12 are just in a non-adhesive contact with the bonding pads 32. The sidewall 24 of the bonding-aid member 20 is designed to have such a height that the bonding portions 13 of the leads 12 is in abutment with the bonding pads 32 when the flange portion 23 is fixedly adhered to the solder resist 33 through the adhesive materials 42.

Then, it is ascertained again by the monitor camera 63 whether the bonding portions 13 of the leads 12 are precisely situated on the bonding pads 32.

Figure 5C:
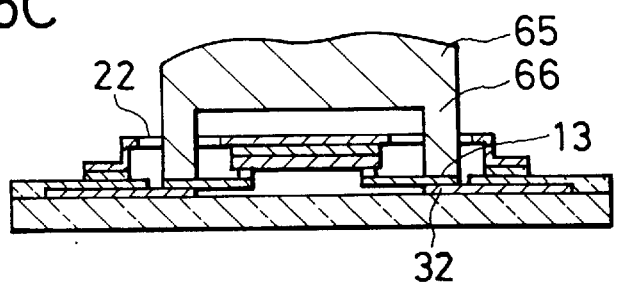

Then, as illustrated in FIG. 5C, a bonding tool 65 having four vertical walls 66 is lowered through the opening 22 of the bonding-aid member 22 to compress the bonding portions 13 of the leads 12 against the bonding pads 32 of the substrate 30. Thus, the bonding portions 13 are bonded onto the bonding pads 32 by heat and pressure.

Figure 5D:
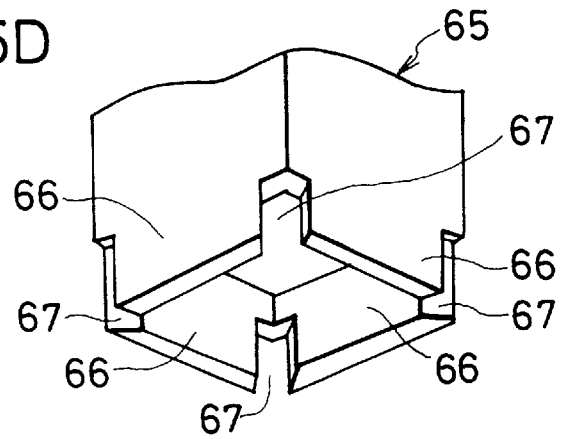
FIG. 5D is a perspective view illustrating the bonding tool to be used in the first embodiment.

FIG. 5D illustrates the detail of the bonding tool 65. The bonding tool 65 has four vertically extending walls 66. These four walls define four sides of a square, and are separated by four cut-outs 67 formed at corners of the rectangle. The cut-outs 67 are formed in order to avoid the interference of the bonding tool 65 with the support portions 25 of the bonding-aid member 20. Each of the walls 66 has a cross-section able to pass through the opening 22 of the bonding-aid member 20.

The bonding-aid member 20 may be removed from the semiconductor chip 10 after the semiconductor chip 10 has been bonded to the substrate 30. In order to render the bonding-aid member 20 removable, the adhesive materials 41 and 42 are selected from those which can be further processed to lose an adhesive force. For instance, the adhesive materials 41 and 42 may be composed of a thermoplastic adhesive which loses its adhesive force when heated at 150 degrees centigrade, or an ultra-violet (UV) adhesive which loses its adhesive force by radiating ultraviolet ray thereto. When the UV adhesive is used, the bonding-aid member 20 has to be made of a transparent material such as glass or plastic so that ultra-violet rays can pass therethrough.

In the above mentioned embodiment, the outer lead bonding may be carried out for all the leads 12 at the same time, or for individual leads 12 one by one. Ultrasonic bonding may be used as well as thermocompression bonding. In place of the vacuum-attracting arm 61 may be used other devices such as a mechanical holder for clamping a semiconductor chip therebetween.

Figure 6A:
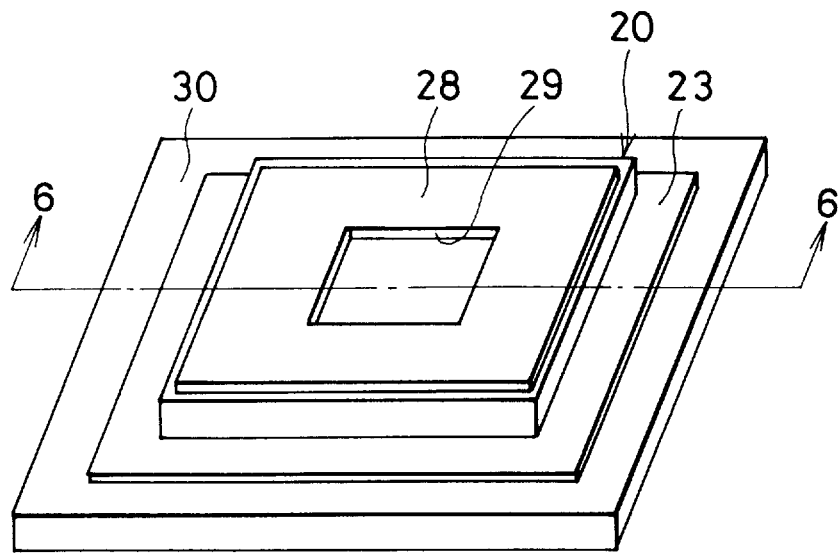
FIG. 6A is a perspective view illustrating a semiconductor chip adhered to the bonding-aid member which is covered with the cap.
Figure 6B:
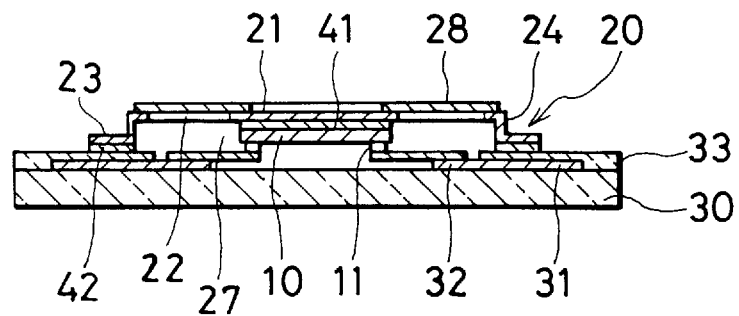
FIG. 6B is a cross-sectional view taken along the line 6—6 in FIG. 6A.

As illustrated in FIGS. 6A and 6B, the openings 22 of the bonding-aid member 20 may be covered with a cap 28 after the semiconductor chip 10 has been bonded to the substrate 30. The cap 28 is composed of a square plate, and is equal in size to an area surrounded by the sidewall 24. The cap 28 is formed with a square opening 29 corresponding to the central portion 22 of the bonding-aid member 20. The cap 28 is fixedly adhered to the bonding-aid member 20 to thereby hermetically seal the openings 22. The cap 28 may be adhered to the bonding-aid member 20 after a space formed between the bonding-aid member 20 and the semiconductor chip 10 has been filled with resin. By composing the bonding-aid member 20 and the cap 28 of metal, an electromagnetic shield effect and heat radiation property can be further enhanced.

Figure 7:
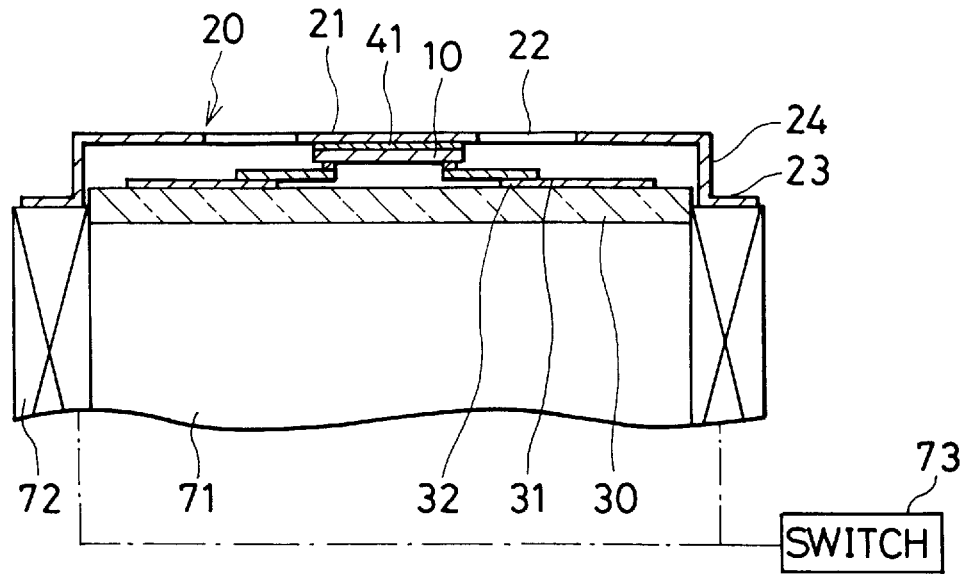
FIG. 7 is a cross-sectional view of a semiconductor chip adhered to the bonding-aid member in the second embodiment of the invention.

FIG. 7 illustrates the second embodiment in accordance with the invention. Parts or elements corresponding to those of the first embodiment illustrated in FIGS. 3A to 6B have been provided with the same reference numerals, and hence will not be explained again.

In this embodiment, a magnet stage 72 is provided around the stage 71 on which the substrate 30 is mounted. The magnet stage 72 is composed of a plurality of electromagnets, and can be controlled to turn on or off through a switch 73. The bonding-aid member 20 is made of metal, and the flange portion 23 thereof is designed to be adhered onto the magnet stage 72.

In operation, the semiconductor chip 10 is detachably adhered to a lower surface of the central portion 21 of the bonding-aid member 20 through the adhesive material 41, similarly to the first embodiment The adhesive material 41 is composed of thermoplastic adhesive which loses its adhesive force when heated at 150 degrees centigrade. Then, the positional adjustment of the bonding portions 13 of the leads 12 onto the bonding pads 32 is carried out through the openings 22 of the bonding-aid member 20 by using the monitor camera 63 (not illustrated. See FIG. 5A). After the positional adjustment has been completed, the magnet stage 72 is turned on through the switch 73. Then, the magnetic force generated by the magnet stage 72 attracts the flange portion 23 of the bonding-aid member 20 to the magnet stage 72. Thus, the bonding-aid member 20 becomes fixed onto the magnet stage 72, and hence the semiconductor chip 10 is mounted on the substrate 30 with the bonding portions 13 of the leads 12 precisely bonded onto the bonding pads 32.

After the bonding has been accomplished, the magnet stage 72 is turned off to take the bonding-aid member 20 off the magnet stage 72. Then, the bonding member 20 is separated from the semiconductor chip 10 by heating the adhesive material 41 at 150 degrees centigrade.

Figure 8:
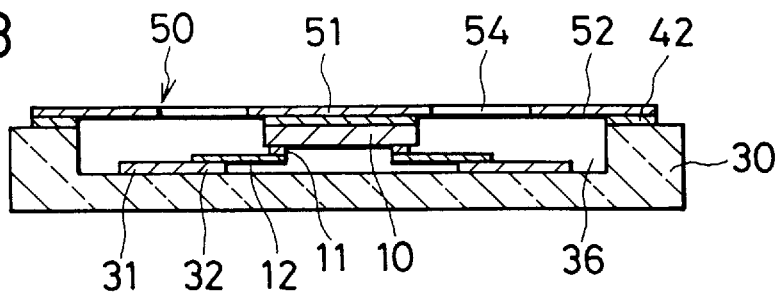
FIG. 8 is a cross-sectional view of a semiconductor chip adhered to the bonding-aid member in the third embodiment of the invention.
Figure 9:
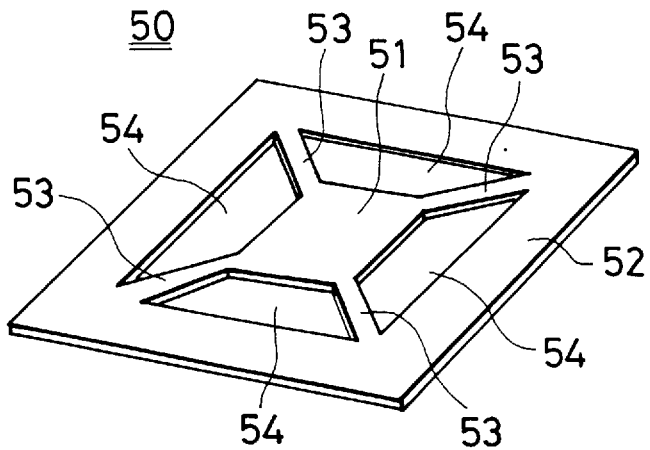
FIG. 9 is a perspective view illustrating a bonding-aid member to be used in the third embodiment of the invention.

FIGS. 8 and 9 illustrate the third embodiment in accordance with the invention. Parts or elements corresponding to those of the first embodiment have been provided with the same reference numerals, and hence will not be explained again.

In this embodiment, the substrate 30 is formed with a recess 36. The wiring layer 31 defining the bonding pads 32 is formed on a bottom surface of the recess 36. The recess 36 is designed to have a depth equal to a total height of the semiconductor chip 10 and the bonding pads 32.

FIG. 9 illustrates a bonding-aid member 50 to be used in the embodiment. The bonding-aid member 50 has a flat configuration, and comprises a square portion 51, a marginal portion 52, and four support portions 53 for connecting the central portion 51 to the marginal portion 52. The central portion 51 is rectangular in shape, and the marginal portion 52 surrounds the central portion 51. The four support portions 53 extend diagonally between the central portion 51 and the marginal portion 52. Thus, the bonding-aid member 50 has openings 54 between the central portion 51 and the marginal portion 52 for exposing all the bonding portions 13 of the leads 12 when the semiconductor chip 10 is adhered to the bonding-aid member 50.

In operation, the semiconductor chip 10 is detachably adhered to a lower surface of the central portion 51 of the bonding-aid member 50 through the adhesive material 41. The adhesive materials 41 is composed of thermoplastic adhesive, similar to the second embodiment. Then, the positional adjustment of the bonding portions 13 of the leads 12 onto the bonding pads 32 is carried out through the openings 54 of the bonding-aid member 50 by using the monitor camera 63 (not illustrated. See FIG. 5A). After the positional adjustment has been completed, the bonding-aid member 50 is adhered at the marginal portion 52 thereof onto the substrate 30 through the adhesive material 42. Thus, the semiconductor chip 10 is mounted on the substrate 30 with the bonding portions 13 of the leads 12 precisely bonded onto the bonding pads 32.

In this embodiment, the bonding-aid member 50 may be removed the semiconductor chip 10 and the substrate 30 by composing the adhesive materials 41 and 42 of a thermoplastic adhesive which loses its adhesive force when heated at 150 degrees centigrade, or ultra-violet (UV) adhesive which loses its adhesive force by radiating ultra-violet ray thereto.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. An outer lead bonding apparatus for bonding a plurality of leads extending outwardly of a semiconductor chip to bonding pads mounted on a substrate, said apparatus comprising:

a bonding-aid member including:
   a chip support area for the semiconductor chip to be adhered to, said chip support area comprising a lower surface of a central portion of said bonding aid member,
   a substrate contact area to be adhered to the substrate, said substrate contact area comprising a marginal portion surrounding said central portion, and
   means for exposing distal ends of said leads when the semiconductor chip is adhered to said chip support area and said marginal portion is in contact with the substrate, the distal ends being the portion of said leads to be bonded to said bonding pads, said means comprising an opening in said bonding-aid member between said central position and said marginal portion;
means for detecting whether said exposed distal ends of said leads align with said bonding pads; and
a bonding tool having compressing portions for compressing said leads to said bonding pads based on a detection by said means for detecting, said compressing portions having a cross-section able to pass through said opening of said bonding member.

2. The outer lead boding apparatus as set forth in claim 1 further comprising a sucking device for sucking said central portion of said bonding-aid member at its upper surface.

3. The outer lead bonding apparatus as set forth in claim 1, wherein said bonding-aid member is composed of metal.

4. The outer lead bonding apparatus as set forth in claim 1, wherein said bonding-aid member is composed of an insulative material.

5. The outer lead bonding apparatus as set forth in claim 1, further comprising:

an adhesive for adhering said semiconductor chip to said lower surface of said central portion of said bonding-aid member; and a reversible adhesiveness material for adhering said marginal area of said bonding-aid member to said substrate by means of an adhesive, said reversible adhesiveness material being able to lose an adhesive force thereof.

6. The outer lead bonding apparatus as set forth in claim 5, wherein said adhesive is thermosetting resin or silver paste.

7. The outer lead bonding apparatus as set forth in claim 5, wherein said reversible adhesiveness material is a UV adhesive which loses an adhesive force thereof by radiating ultra-violet light thereto, and said bonding-aid member includes a transparent material.

8. The outer lead bonding apparatus as set forth in claim 1 further comprising resin to fill therewith a space present between said bonding-aid member and said semiconductor chip.

9. The outer lead bonding apparatus as set forth in claim 1 further comprising a cap for covering said opening therewith.

10. An outer lead bonding apparatus for bonding a plurality of leads extending outwardly of a semiconductor chip to bonding pads mounted on a substrate, said apparatus comprising:

a bonding-aid member including:
   a horizontally extending central planar portion to adhere the semiconductor chip to,
   a vertically extending sidewall,
   a flange portion extending outward horizontally from a lowermost end of said sidewall, said flange portion to be adhered to said substrate, a support portion for connecting said central portion to said sidewall, and an opening between said central portion and said sidewall, means for exposing distal ends of said leads at which said lead are to be bonded to said bonding pads when the semiconductor chip is adhered to the horizontally extending central planar portion and the flange portion contacts the substrate, said means comprising an opening between said central portion and said sidewall defined by said support portion, the distal ends being the portion of said leads to be bonded to said bonding pads;

means for detecting whether said exposed distal ends of said leads align with said bonding pads; and a bonding tool having a wall for compressing said leads to said bonding pads, based on a detection by said means for detecting, to bond them with each other, said wall having a cross-section able to pass through said opening of said bonding-aid member.

11. The outer lead bonding apparatus as set forth in claim 10, wherein said central portion is a rectangle in shape, and said sidewall surrounding said central portion similarly is shaped to said central portion.

12. The outer lead bonding apparatus as set forth in claim 11, wherein said support portion extend diagonally between said central portion and said sidewall of said bonding-aid member.

13. The outer lead boding apparatus as set forth in claim 12, wherein said wall of said bonding tool comprises four walls defining four sides of a rectangle, said four walls being separated by four cut-outs formed at corners of said rectangle.

14. An outer lead bonding apparatus for bonding a plurality of leads extending outwardly of a semiconductor chip to bonding pads mounted on a substrate, said apparatus comprising:

a bonding-aid member composed of magnetic material and including:
a chip support area for the semiconductor chip to be adhered to, said chip support area comprising a lower surface of a central portion of said bonding-aid member,
a marginal portion for contacting said substrate, and
means for exposing distal ends of said leads when the semiconductor chip is adhered to said chip support area and said marginal portion is in contact with the substrate, the distal ends being the portion of said leads to be bonded to said bonding pads, said means comprising an opening in said bonding-aid member between said central position and said marginal portion; means for detecting whether said exposed distal ends of said leads align with said bonding pads;

a magnet disposed around said substrate, said marginal portion of said bonding-aid member to be attracted to said magnet; and a bonding tool having compressing portions for compressing said leads to said bonding pads based on a detection by said means for detecting, said compressing portions having a cross-section able to pass through said opening of said bonding member.

15. The outer lead bonding apparatus as set forth in claim 14, wherein said magnet is on/off controllable.

16. An outer lead bonding apparatus for bonding a plurality of leads extending outwardly of a semiconductor chip to bonding pads mounted on a substrate, said substrate being formed with a recess, said bonding pads being disposed on a bottom surface of said recess, said recess having a depth equal to a total height of said semiconductor chip and said bonding pad, said apparatus comprising:

a bonding-aid member comprising a flat plate, said bonding-aid member including:
a chip support area for the semiconductor chip to be adhered to, said chip support area comprising a lower surface of a central portion of said bonding aid member,
a marginal portion for contacting said substrate,
a support portion for connecting said central portion to said marginal portion, and
means for exposing distal ends of the leads when the semiconductor chip is adhered to said chip support area and said marginal portion is in contact with the substrate, said means comprising an opening defined by said support portion between said central portion and said marginal portion, the distal ends being the portion of said leads to be bonded to said bonding pads, means for detecting whether said exposed distal ends of said leads are aligned with said bonding pads; and a bonding tool having a wall for compressing said leads to said bonding pads to bond them with each other based on a detection by said means for detecting, said wall having a cross-section able to pass through said opening of said bonding-aid member.

17. A bonding-aid member to be used with an outer lead bonding apparatus which bonds a plurality of leads extending outwardly of a semiconductor chip to bonding pads mounted on a substrate, said bonding-aid member comprising:

a chip support area for the semiconductor chip to be adhered to, said chip support area comprising a lower surface of a central portion of said bonding aid member;
a marginal portion to be adhered to the substrate, said marginal portion surrounding said central portion; and
means for exposing distal ends of said leads when the semiconductor chip is adhered to said chip support area and said marginal portion is in contact with the substrate, the distal ends being the portion of said leads to be bonded to said bonding pads, said means comprising an opening in said bonding-aid member between said central position and said marginal portion.

18. The bonding-aid member as set forth in claim 17, wherein said bonding-aid member is composed of metal.

19. The bonding-aid member as set forth in claim 17, wherein said bonding-aid member is composed of an insulative material.

20. A bonding-aid member to be used with an outer lead bonding apparatus which bonds a plurality of leads extending outwardly of a semiconductor chip to bonding pads mounted on a substrate, said bonding-aid member comprising:

a horizontally extending central planar portion to adhere the semiconductor chip to:
a vertically extending sidewall;
a flange portion extending outward horizontally from a lowermost end of said sidewall, said flange portion to be adhered to said substrate;
a support portion for connecting said central portion to said sidewall; and
means for exposing distal ends of said leads when the semiconductor chip is adhered to the horizontally extending central planar portion and the flange portion contacts the substrate, said means comprising an opening between said central portion and said sidewall defined by said support portion, the distal ends being the portion of said leads to be bonded to said bonding pads.

21. The bonding-aid member as set forth in claim 20, wherein said central portion is a rectangle in shape, and said sidewall surrounding said central portion similarly is shaped to said central portion.

22. The bonding-aid member as set forth in claim 21, wherein said support portion extends diagonally between said central portion and said sidewall of said bonding-aid member.

23. A bonding-aid member to be used with an outer lead bonding apparatus which bonds a plurality of leads extending outwardly of a semiconductor chip to bonding pads mounted on a substrate, said substrate being formed with a recess, said bonding pads being disposed on a bottom surface of said recess, said recess having a depth equal to a total height of said semiconductor chip and said bonding pads, said bonding-aid member comprising a flat plate, which includes:

a chip support area for the semiconductor chip to be adhered to, said chip support area comprising a lower surface of a central portion of said bonding aid member, a marginal portion for contacting said substrate, a support portion for connecting said central portion to said marginal portion, and means for exposing distal ends of the leads when the semiconductor chip is adhered to said chip support area and said marginal portion is in contact with the substrate, said means comprising an opening formed by said support portion between said central portion and said marginal portion, the distal ends being the portion of said leads to be bonded to said bonding pads.

* * * * *